(12) United States Patent
Sankaran et al.

(10) Patent No.: US 7,458,007 B2
(45) Date of Patent: Nov. 25, 2008

(54) ERROR CORRECTION STRUCTURES AND METHODS

(75) Inventors: Jagadeesh Sankaran, Dallas, TX (US); David Hoyle, Glendale, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 1324 days.

(21) Appl. No.: 09/788,805

(22) Filed: Feb. 20, 2001

(65) Prior Publication Data

US 2002/0002693 A1 Jan. 3, 2002

Related U.S. Application Data (60) Provisional application No. 60/183,533, filed on Feb. 18, 2000, provisional application No. 60/183,419, filed on Feb. 18, 2000.

(51) Int. Cl.
*H03M 13/29* (2006.01)
*H03M 13/51* (2006.01)
(52) U.S. Cl. .................................. 714/782; 714/781
(58) Field of Classification Search ............... 714/782, 714/784, 753, 755, 758, 781, 752
See application file for complete search history.

(56) References Cited

U.S. PATENT DOCUMENTS

| | | | | |
|---|---|---|---|---|
| 3,745,526 A | * | 7/1973 | Hong et al. | 714/777 |
| 4,151,510 A | * | 4/1979 | Howell et al. | 714/758 |
| 4,875,211 A | * | 10/1989 | Murai et al. | 714/784 |
| 4,890,287 A | * | 12/1989 | Johnson et al. | 714/753 |
| 5,051,998 A | * | 9/1991 | Murai et al. | 714/762 |
| 5,537,429 A | * | 7/1996 | Inoue | 714/755 |
| 5,577,054 A | * | 11/1996 | Pharris | 714/762 |
| 5,677,919 A | * | 10/1997 | Antia | 714/784 |
| 5,872,799 A | * | 2/1999 | Lee et al. | 714/755 |
| 5,974,580 A | * | 10/1999 | Zook et al. | 714/755 |
| 6,041,431 A | * | 3/2000 | Goldstein | 714/784 |

FOREIGN PATENT DOCUMENTS

JP 09162753 A * 6/1997

* cited by examiner

*Primary Examiner*—Cynthia Britt
*Assistant Examiner*—Dipakkumar Gandhi
(74) *Attorney, Agent, or Firm*—Mirna Abyad; Wade J. Brady, III; Frederick J. Telecky, Jr.

(57) ABSTRACT

A syndrome evaluation with partitioning of a received block of symbols into subsets and interleaved partial syndrome evaluations to overcome multiplier latency. Parallel syndrome evaluations with a parallel multiplier.

5 Claims, 11 Drawing Sheets

| $r_0$ | $r_0$ | $r_0$ | $r_0$ |
|---|---|---|---|
| $r_1$ | $r_1$ | $r_1$ | $r_1$ |
| ⋮ | ⋮ | ⋮ | ⋮ |
| $r_j$ | $r_j$ | $r_j$ | $r_j$ |
| ⋮ | ⋮ | ⋮ | ⋮ |
| $r_{n/4}$ | $r_{n/4}$ | $r_{n/4}$ | $r_{n/4}$ |
| ⋮ | ⋮ | ⋮ | ⋮ |
| $r_{n/4+j}$ | $r_{n/4+j}$ | $r_{n/4+j}$ | $r_{n/4+j}$ |
| ⋮ | ⋮ | ⋮ | ⋮ |
| $r_{n/2}$ | $r_{n/2}$ | $r_{n/2}$ | $r_{n/2}$ |
| ⋮ | ⋮ | ⋮ | ⋮ |
| $r_{n/2+j}$ | $r_{n/2+j}$ | $r_{n/2+j}$ | $r_{n/2+j}$ |
| ⋮ | ⋮ | ⋮ | ⋮ |
| $r_{3n/4}$ | $r_{3n/4}$ | $r_{3n/4}$ | $r_{3n/4}$ |
| ⋮ | ⋮ | ⋮ | ⋮ |
| $r_{3n/4+j}$ | $r_{3n/4+j}$ | $r_{3n/4+j}$ | $r_{3n/4+j}$ |
| ⋮ | ⋮ | ⋮ | ⋮ |
| $r_{n-1}$ | $r_{n-1}$ | $r_{n-1}$ | $r_{n-1}$ |

ERROR CORRECTION STRUCTURES AND METHODS

CROSS-REFERENCE TO RELATED APPLICATIONS

This application claims priority from provisional application Ser. No. 60/183,533, filed Feb. 18, 2000. The following copending application with common assignee of this application disclose related subject matter: Ser. No. 60/183,419 filed Feb. 18, 2000 (TI-30531).

BACKGROUND OF THE INVENTION

The invention relates to electronic devices, and, more particularly, to error correction structures and methods.

Digital communication and storage systems typically include error correction coding in order to overcome errors arising from the transmission or storage medium. Forward error-correction coding (FEC) systems add redundancy to the transmitted signal so that the receiver can detect and correct errors using only the received signal. This eliminates the need for the receiver to send requests for retransmission to the transmitter.

Figure 1:
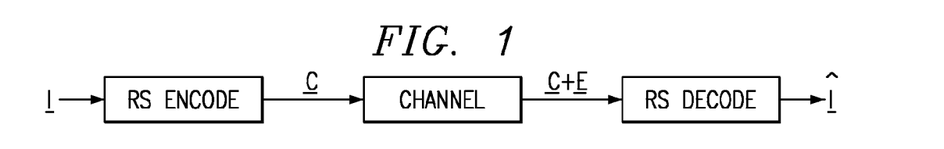
FIGS. 1-2 schematically illustrate FEC coding.
Figure 2:
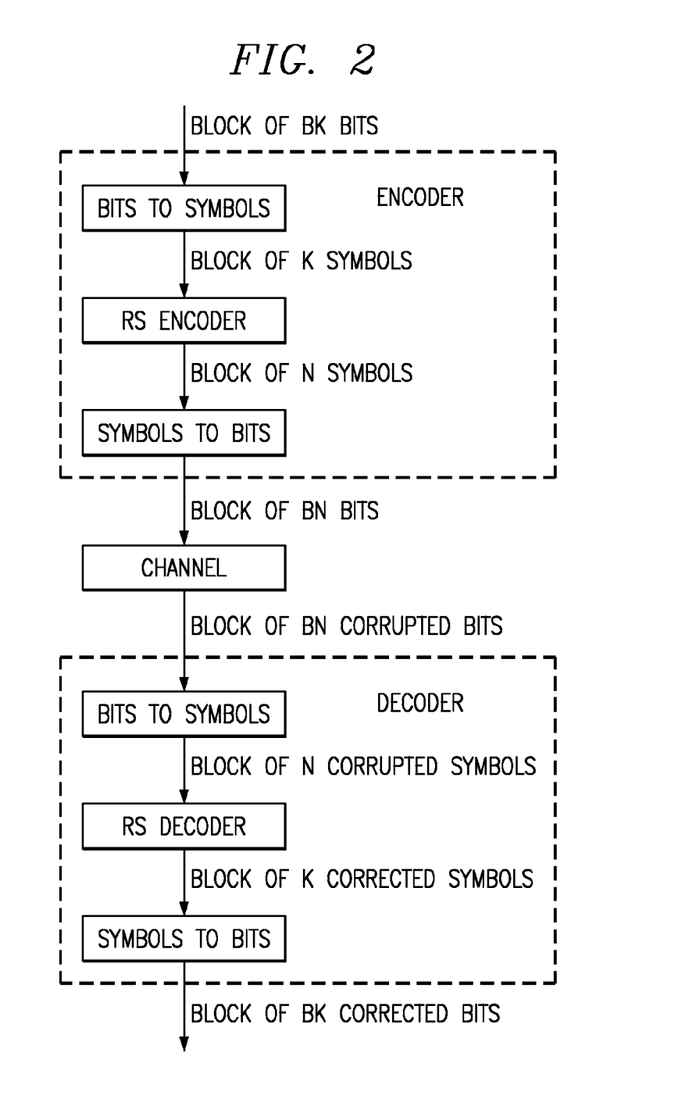

FIGS. 1-2 are high level views of a FEC system. In particular, FIG. 1 shows a block of information symbols, I, transformed into a codeword C which is a larger block that contains both the original information and redundant symbols. After transmission over a channel, the received block of symbols can be represented as C+E where E is a block of error symbols. The decoder generates I' from C+E, and I' will equal I if the number of errors symbols in E is within the correction capabilities of the code.

FIG. 2 shows a more detailed description of the coding. A block of bk information bits is divided into k groups of b bits and each group of b bits represents a symbol, producing a block of k information symbols for coding. The encoder operates on the block of k information symbols to produce a codeword block of n symbols containing the original information in some form as well as redundancy. The code can be designed so that the redundancy is used for error detection only, error correction only, or a combination of some error detection and some error correction. The codeword block of n symbols is then translated into a block of bn bits and transmitted over the channel. The receiver front-end produces a block of bn bits that might be corrupted, depending upon the amount of channel distortion. The block of bn bits is translated into a block of n symbols and processed with the decoder. As long as the transmission errors lead to at most $t=(n-k)/2$ erroneous symbols, a hard-decision decoder can reliably recover the input k information symbols (and thus the input bk bits). The price paid for the added redundancy is the increase in the number of symbols to transmit by a factor of $n/k$. Of course, this means an information decrease by a factor of $k/n$ for a constant transmission rate.

One of the more popular error correction code types is BCH codes which are cyclic block codes that utilize Galois fields beyond the simplest GF(2) (the usual binary $\{0,1\}$) to prescribe code generator polynomials. Indeed, a BCH code uses a minimal degree generator polynomial with roots being a sequence of powers of a primitive element of a Galois field which may be an extension field of the symbol field (codeword components' field). This leads to computations involving multiplications of Galois field elements for the usual decoding steps of syndrome calculation, association with error pattern (determine error-locator polynomial and error locations and values), and error correction. Reed-Solomon codes are a subclass of BCH codes with both symbols and generator polynomial roots in the same field $GF(p^m)$. The commonly used field $GF(2^m)$ allows the elements to be represented as m-bit words.

The nonzero elements of a Galois field form a cyclic multiplicative subgroup and can be expressed as powers of a primitive element $\alpha$. That is, the elements of $GF(p^m)$ are $\{0, 1, \alpha, \alpha^2, \ldots, (\alpha^q)\}$ where the maximum $q=p^m-2$ and $\alpha^{q+1}=1$. Thus the roots of a generator polynomial $G(x)$ for a BCH code could be $\{\alpha, \alpha^2, \ldots, \alpha^{2t}\}$ for a code which can correct t errors per codeword. The generator polynomial thus would be the least common multiple of the polynomials $\phi_j(x)$ for $j=1, 2, \ldots, 2t$ where $\phi_j(x)$ is a minimal polynomial for $\alpha^j$. The special case of the symbol field being the same as the root field (Reed-Solomon) implies $\phi_j(x)$ is simply $x-\alpha^j$.

Systematic BCH encoding, as with cyclic codes in general, forms codewords by concatenating the k information symbols with n–k parity symbols which are computed according to $X^{n-k}I(x) \bmod G(x)$. The additional n–k parity symbols contain the redundant information that is used by the receiver to choose the most likely transmitted k information symbols. In particular, with receiver soft decision the n–k parity symbols can be used to correct t error symbols and detect s erased symbols provided $2t+s$ is at most equal to n–k. Note that values such as n=204 and k=188 with the field $GF(2^8)$ in a Reed-Solomon code is a commonly used (shortened) code for high speed modems. Such a (204,188) code can correct 8 error symbols per 204-symbol codeword. Similarly, the (200, 192) code can correct 4 errors per 200-symbol codeword.

Figure 3:
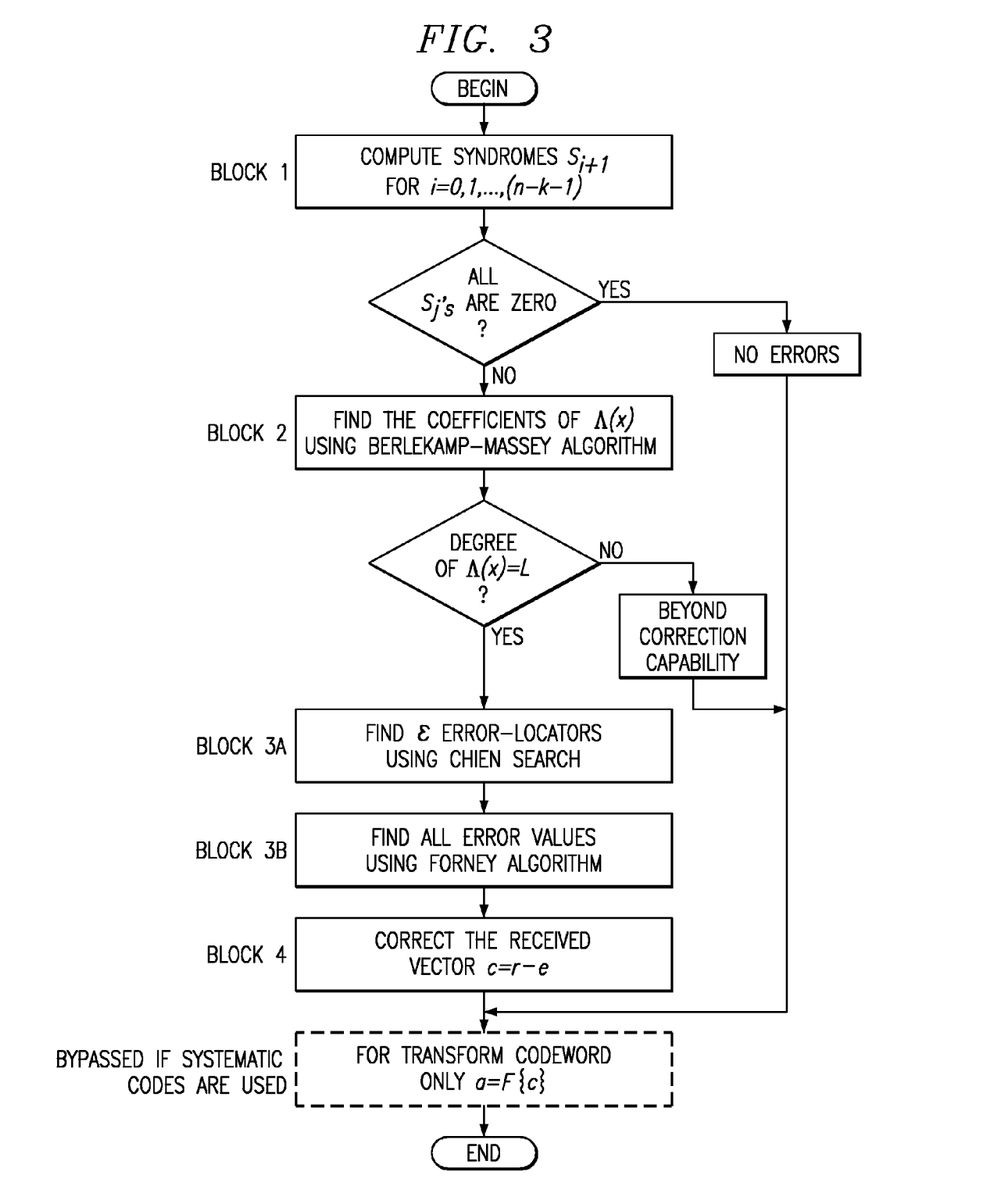
FIG. 3 is a flow for BCH decoding.

FIG. 3 is a flow chart for a commonly-used method of errors-only decoding BCH coded information and which proceeds as follows. Take $n-k=2t$ so that at most t errors can be corrected in a codeword of n symbols. The received polynomial $R(x)=C(x)+E(x)$ where $C(x)$ is the codeword polynomial and $E(x)$ is the error polynomial. $E(x)=\Sigma_j e_j x^j$ with a non-zero $e_j$ the error occurring in the jth position (symbol) of $C(x)$. The decoder is to find the error positions and values to reconstruct $E(x)$ and then recover $C(x)$ as $R(x)-E(x)$. The method first evaluates $R(x)=r_0 x^{n-1}+r_1 x^{n-2}+\ldots+r_{n-1}$ at the 2t roots of the code generator polynomial $(G(x)=\pi_j(x-\alpha^j)$ for Reed-Solomon) and denotes these 2t evaluations as the syndromes $S_0, S_1, S_2, \ldots, S_{2t-1}$. That is, with the roots of $G(x)$ being $\alpha^j$ for $j=0, 1, 2, \ldots, 2t-1$ (which are denoted $\beta_0, \beta_1, \beta_2, \ldots \beta_{2t-1}$, respectively) the syndromes are (with * denoting Galois field multiplication):

$$S_0 = r_0 * \beta_0^{n-1} + r_1 * \beta_0^{n-2} + r_2 * \beta_0^{n-3} + \ldots + r_{n-2} * \beta_0 + r_{n-1}$$

$$S_1 = r_0 * \beta_1^{n-1} + r_1 * \beta_1^{n-2} + r_2 * \beta_1^{n-3} + \ldots + r_{n-2} * \beta_1 + r_{n-1}$$

$$\ldots$$

$$S_{2t-1} = r_0 * \beta_{2t-1}^{n-1} + r_1 * \beta_{2t-1}^{n-2} + r_2 * \beta_{2t-1}^{n-3} + \ldots + r_{n-2} * \beta_{2t-1} + r_{n-1}$$

Because $C(x)$ is a product of $G(x)$, $C(x)$ vanishes at each of the 2t roots of $G(x)$, and the syndrome $S_j$ equals $E(\beta_j)$. Thus the 2t syndrome equations are nonlinear relations between the 2t syndromes, the at most t error locations, and the at most t error values; that is, 2t nonlinear equations for at most 2t unknowns.

Next, linearize these nonlinear syndrome equations by introduction of the error locator polynomial, $\Lambda(x)=\pi_m(1+X_m x)=1+\Sigma_m \Lambda_m X^m$, where $X_m$ is the mth error location. The error locator polynomial has degree equal to the (not-yet-known) number of errors. That is, $X_m=\alpha^j$ for the mth j for which $e_j$ is nonzero, and the roots of $\Lambda(x)$ are the inverses of the error locations.

Multiplying the defining equation for $\Lambda(x)$ by the error values and powers of the error locations and summing leads to n−k−e linear equations for the e unknowns $\Lambda_j$ with coefficients of these linear equations being an array of the syndromes $S_0$ to $S_{2e-2}$ and the inhomogeneous terms being the sequence of syndromes $S_e$ to $S_{2e-1}$. The number of errors, e, is unknown, so the linear equations cannot be simply solved. Rather, the method of FIG. 3 uses the iterative and inductive Berlekamp-Massey method to find the $\Lambda_j$.

Once the locator polynomial is known, find its roots (the inverses of the error locations) using the Chien search. The Chien search systematically evaluates the locator polynomial $\Lambda(x)$ at all 255 non-zero possible values of the variable and checks for zeros by repeatedly computing $\Lambda(\alpha^j)$ and incrementing j.

Inserting the error locations into the definitions of the syndromes yields simple linear equations for the error values. In fact, the Forney algorithm in FIG. 3 computes the error values without matrix inversion to solve the linear equations. And combining the error values and error locations reconstructs the error polynomial E(x) to subtract from R(x) and lastly recover error-free C(x).

However, efficient computation of the syndromes has problems for systems, especially for systems in which the code (generator polynomial) may change and parallel multiplication is available.

SUMMARY OF THE INVENTION

The present invention provides a BCH code syndrome method with partitioning of the received polynomial plus interleaving of partial syndrome computations within each received polynomial partition.

This has the advantages of avoiding multiplier latency in syndrome computations.

BRIEF DESCRIPTION OF THE DRAWINGS

The drawings are heuristic for clarity.

DESCRIPTION OF THE PREFERRED EMBODIMENTS

System overview

Preferred embodiment syndrome evaluations partition received polynomials into subsets for computation of syndrome portions and reconstruction of the syndromes from the portions. This avoids latency of a Galois multiplier. Further, the preferred embodiments may use parallel Galois multipliers for parallel simultaneous syndrome evaluations and allow changes in code parameters with the same stored codewith differing partitions. Preferred embodiment systems include a digital signal processor with a parallel Galois multiplier, parallel Galois adder (XOR), and memory which implement these syndrome evaluations and other methods to provide realtime decoding of BCH (including Reed-Solomon) coded streams such as used in ADSL communications.

Syndrome preferred embodiments

Figure 4A:
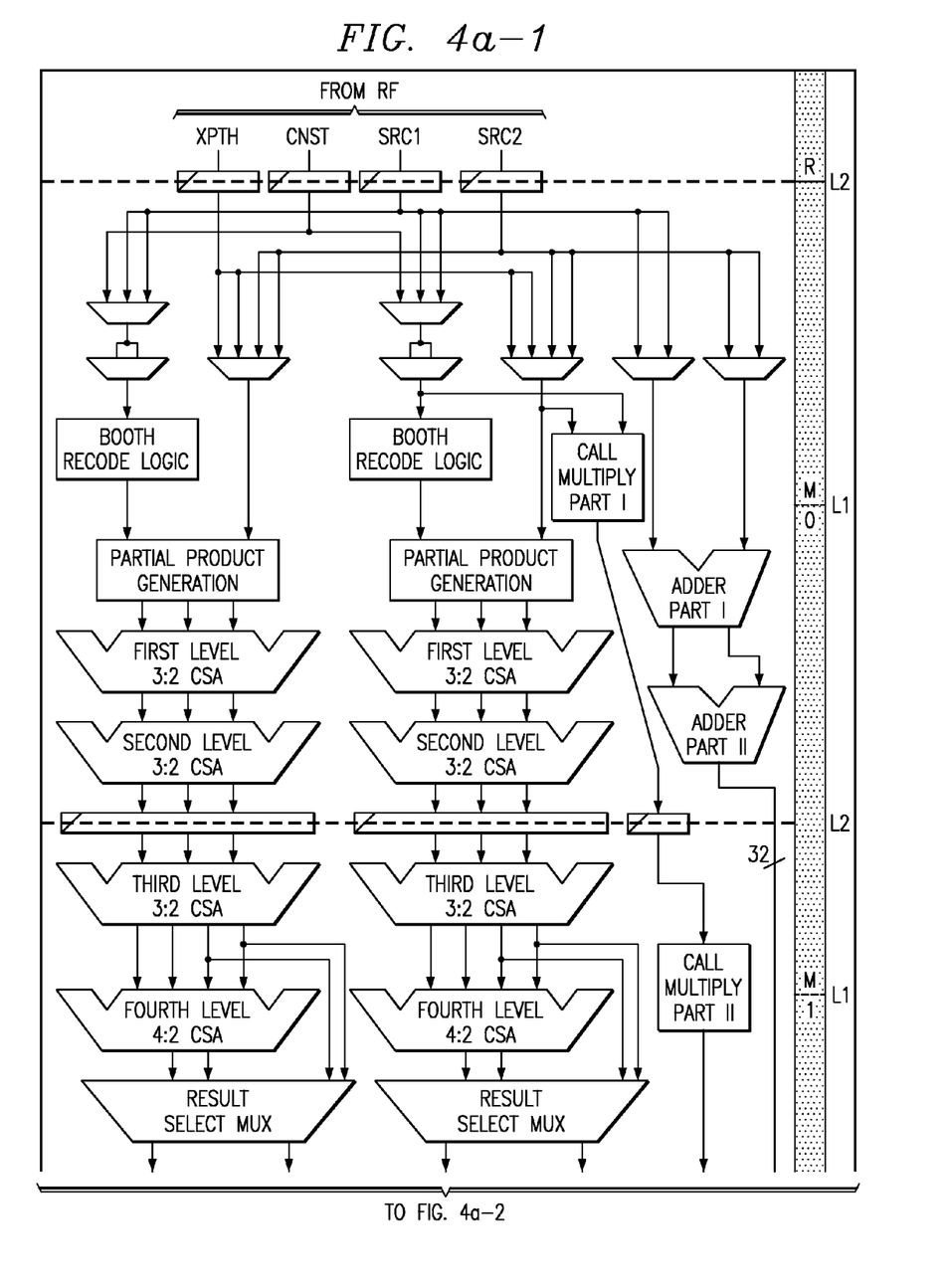
FIGS. 4a-4c show a preferred embodiment Galois multiplier.
Figure 4A:
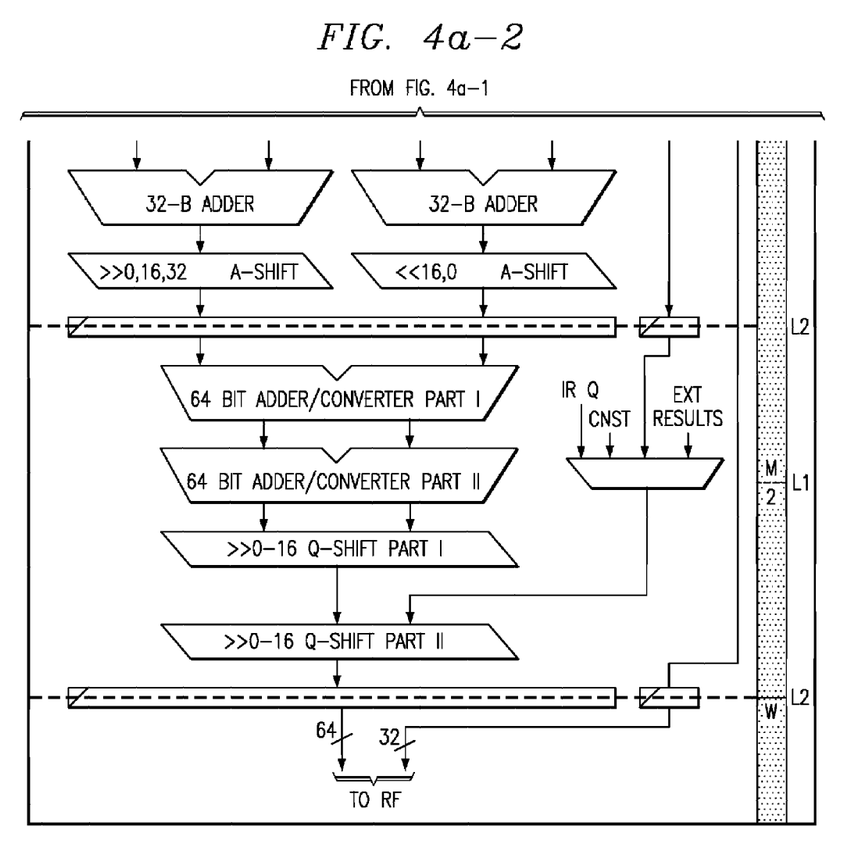
Figure 4B:
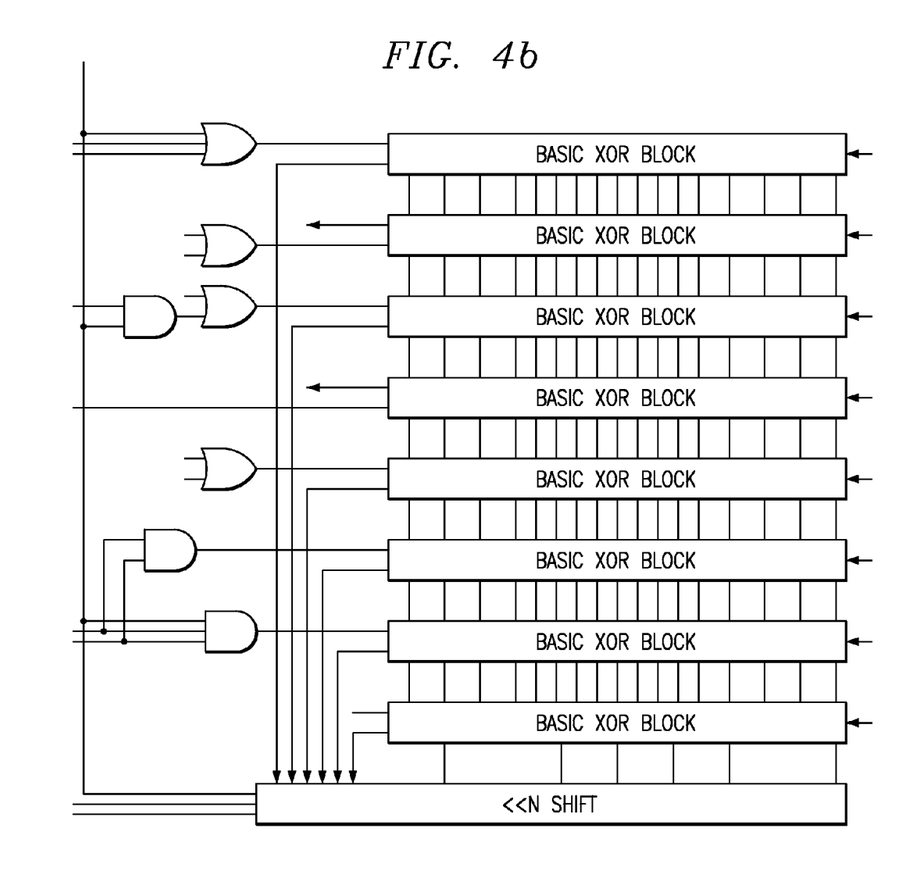
Figure 4C:
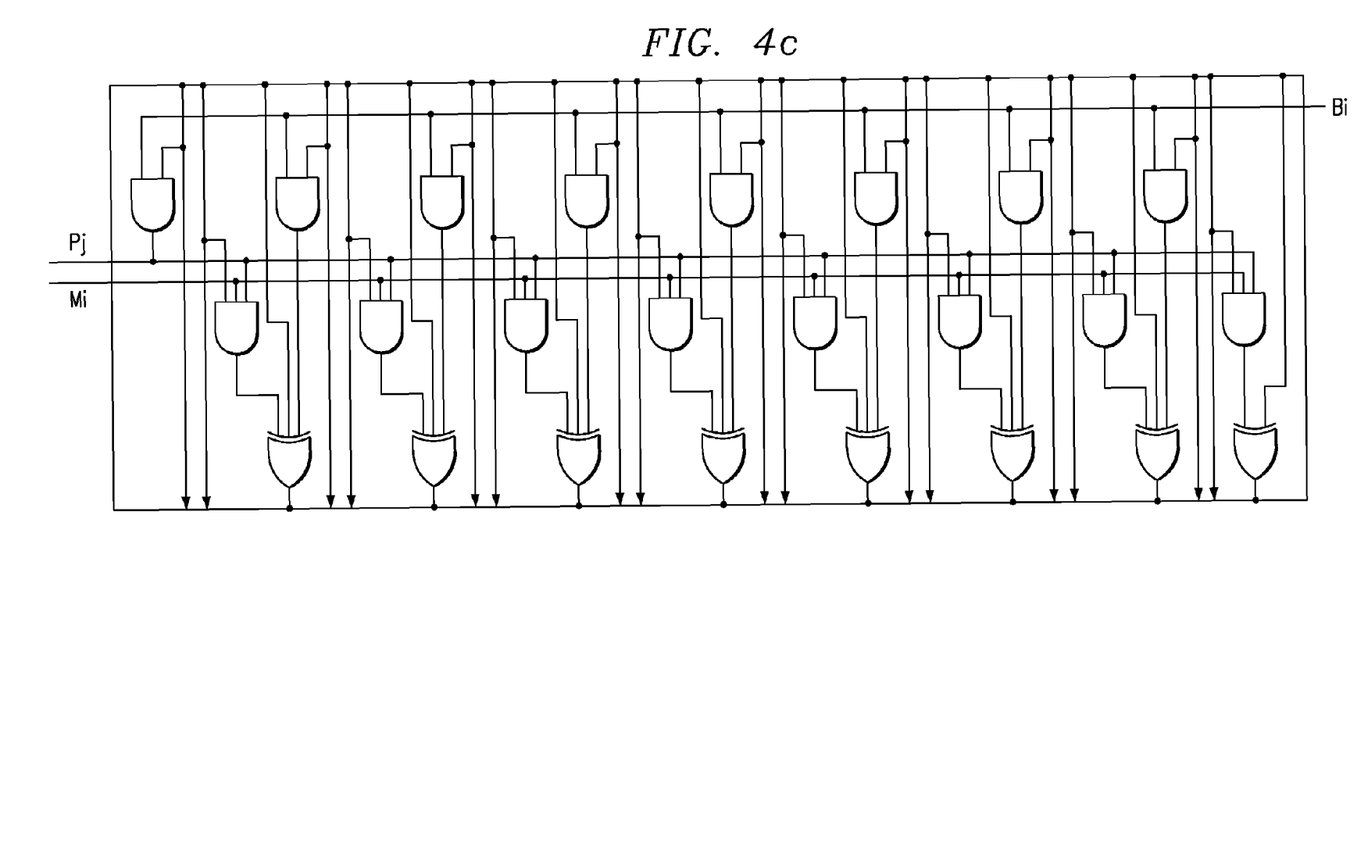

The first syndrome preferred embodiments use GF(256) symbols with (n,k) Reed-Solomon codes with n−k=16 and 8, and with n even or odd. The elements of GF(256) can be expressed as 8-bit symbols (bytes). Also, the first preferred embodiments include a 32-bit GF(256) multiplier which can multiply in parallel 4 pairs of GF(256) elements to yield 4 products as illustrated in FIGS. 4a-4c but with a latency of 4 cycles.

For the case of n−k=2t=16, there are 16 syndromes, $S_i$ for i=0, 1, 2, ..., 15, where $S_i$ is defined as follows in terms of the received codeword R={$r_0$, $r_1$, $r_3$, ..., $r_{n-1}$} with each $r_j$ an element of GF(256) and the ith root $\beta_i=\alpha^i$ of the code generator polynomial with a a primitive element for GF(256):

$$S_i = r_0 * \beta_i^{n-1} + r_1 * \beta_i^{n-2} + r_2 * \beta_i^{n-3} + \ldots + r_{n-2} * \beta_i + r_{n-1}$$

The ith syndrome could be computed by Homer's rule using repeated multiplication by $\beta_i$ plus accumulation of the next received codeword element:

$$S_i = r_0 * \beta_i^{n-1} + r_1 * \beta_i^{n-2} + r_2 * \beta_i^{n-3} + \ldots + r_{n-2} * \beta_i + r_{n-1}$$

$$= (\ldots((r_0 * \beta_{i+r1}) * \beta_i + r_2) * \beta_i + \ldots + r_{n-2}) * \beta_i + r_{n-1}$$

However, the preferred embodiments partition the received codeword into four subsets and employ Horner's method for each subset independently to yield portions of the syndrome; this avoids multiplier latency by interleaving the subset multiplications. After computing each of the four portion of a syndrome, the portions are combined to yield the syndrome.

Figure 5A:
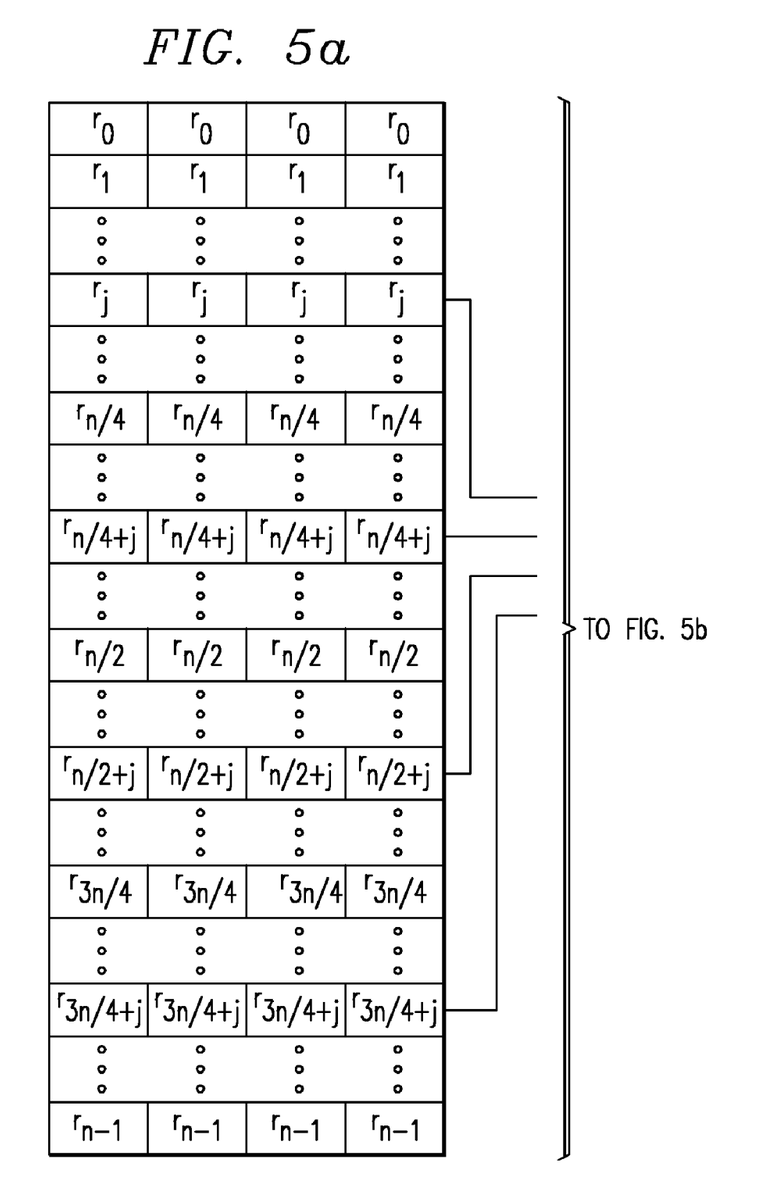
FIGS. 5-7 illustrate preferred embodiment syndrome methods.
Figure 5B:
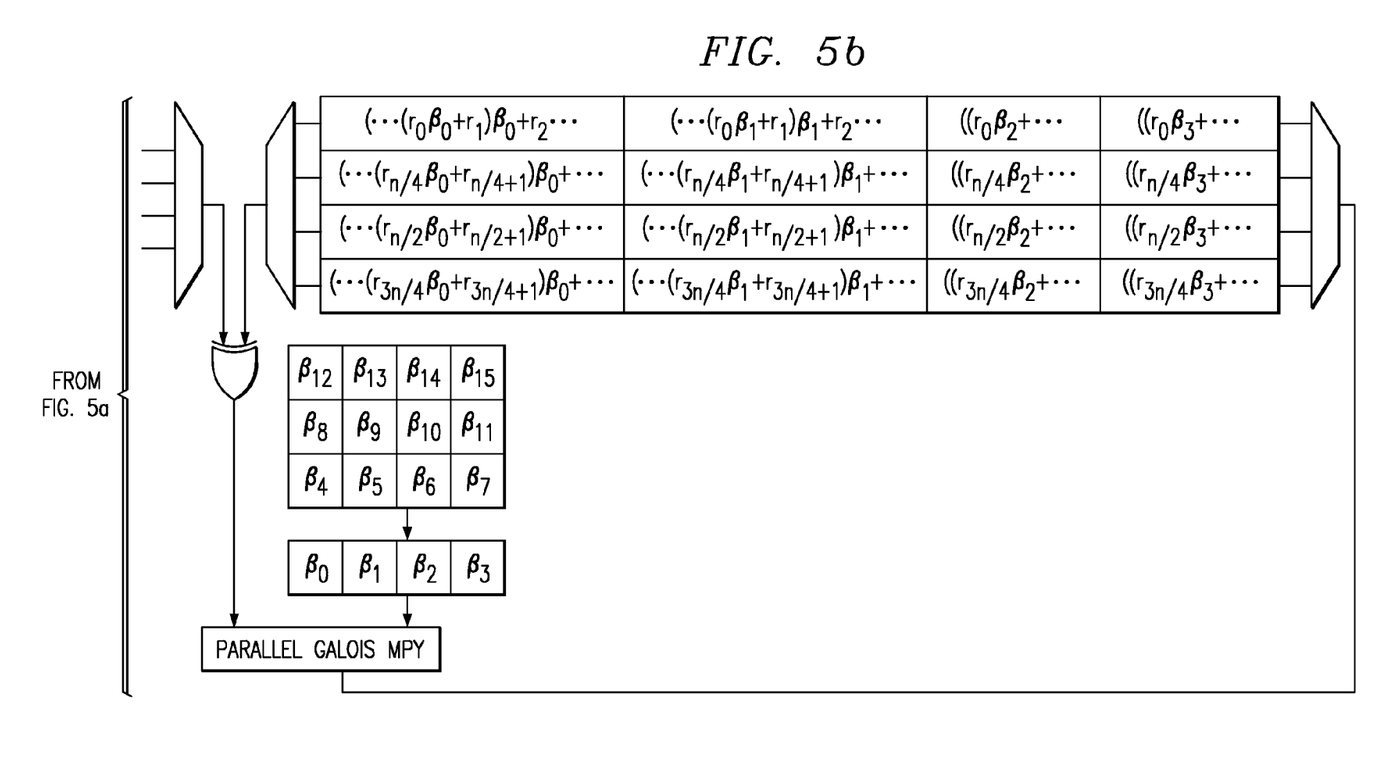

FIG. 5 illustrates the preferred embodiment which computes four syndromes simultaneously because the Galois multiplier allows four parallel multiplications. The MUXs implement the interleaving.

The ith syndrome would be computed as in the following sequences in the Galois multiplier and Galois adder (bitwise XOR) in which the multiplier has a latency so that the product of the multiplier and multiplicand entered on a first cycle is not available until the fourth cycle:

| Multiplier | Adder |
|---|---|
| $r_0 * \beta_i$ | |
| $r_{n/4} * \beta_i$ | |
| $r_{n/2} * \beta_i$ | |
| $r_{3n/4} * \beta_i$ | |
| $(r_0 * \beta_i + r_1) * \beta_i$ | $r_0 * \beta_i + r_1$ |
| $(r_{n/4} * \beta_i + r_{n/4+1}) * \beta_i$ | $r_{n/4} * \beta_i + r_{n/4+1}$ |
| $(r_{n/2} * \beta_i + r_{n/2+1}) * \beta_i$ | $r_{n/2} * \beta_i + r_{n/2+1}$ |
| $(r_{3n/4} * \beta_i + r_{3n/4+1}) * \beta_i$ | $r_{3n/4} * \beta_i + r_{3n/4+1}$ |
| $((r_0 * \beta_i + r_1) * \beta_i r_2) * \beta_i$ | $(r_0 * \beta_i + r_1) * \beta_i + 4_2$ |
| $((r_{n/4} * \beta_i + r_{n/4+1}) * \beta_i + r_{n/4+2}) * \beta_i$ | $(r_{n/4} * \beta_i + r_{n/4+1}) * \beta_i + r_{n/4+2}$ |
| $((r_{n/2} * \beta_i + r_{n/2+1}) * \beta_i + r_{n/2+2}) * \beta_i$ | $(r_{n/2} * \beta_i + r_{n/2+1}) * \beta_i + r_{n/2+2}$ |
| | $(r_{3n/4} * \beta_i + r_{3n/4+1}) * \beta_i + r_{3n/4+2}$ |

-continued

| Multiplier | Adder |
|---|---|
| $((r_{3n/4}*\beta_i + r_{3n/4+1})*\beta_i + r_{3n/4+2})*\beta_i$ | $(r_0*\beta_i + r_1)*\beta_i + r_2)\beta_i + r_3$ |
| $(((r_0*\beta_i + r_1)*\beta_i + r_2)*\beta_i + r_3)*\beta_i$ | $((r_{n/4}*\beta_i + r_{n/4+1})*\beta_i + r_{n/4+2})*\beta_i + r_{n/4+3}$ |
| ... | |
| $(\ldots((r_0*\beta_i + r_1)*\beta_i + \ldots + r_{n/4-2})*\beta_i$ | $(\ldots((r_{n/4}*\beta_i + r_{n/4+1})*\beta_i + \ldots + r_{n/2-2}$ |
| $(\ldots((r_{n/4}*\beta_i + r_{n/4+1})*\beta_i + \ldots + r_{n/2-2})*\beta_i$ | $(\ldots((r_{n/2}*\beta_i + r_{n/2+1})*\beta_i + \ldots + r_{3n/4-2}$ |
| $(\ldots((r_{n/2}*\beta_i + r_{n/2+1})*\beta_i + \ldots + r_{3n/4=2})*\beta_i$ | $(\ldots((r_{3n/4}*\beta_i + r_{3n/4+1})*\beta_i + \ldots + r_{n-2}$ |
| $(\ldots((r_{3n/4}*\beta_i + r_{3n/4+1})*\beta_i + \ldots + r_{n-2})*\beta_i$ | $(\ldots((r_0*\beta_i + r_1)*\beta_i + \ldots + r_{n/4-2})*\beta_i + r_{n/4-1}$ |
| $(\ldots((r_0*\beta_i \ldots + r_{n/4-2})*\beta_i + r_{n/4-1})*\beta_i^{3n/4}$ | $(\ldots((r_{n/4}*\beta_i + r_{n/4+1})*\beta_i + \ldots + r_{n/2-2})*\beta_i + r_{n/2-1}$ |
| $(\ldots((r_{n/4}*\beta_i \ldots + r_{n/2-2})*\beta_i + r_{n/2-1})*\beta_i^{n/2}$ | $(\ldots((r_{n/2}*\beta_i + r_{n/2+1})*\beta_i + \ldots + r_{3n/4-2})*\beta_i + r_{3n/4-1}$ |
| $(\ldots((r_{n/2}*\beta_i \ldots + r_{3n/4-2})*\beta_i + r_{3n/4-1})*\beta_i^{n/4}$ | $(\ldots((r_{3n/4}*\beta_i + r_{3n/4+1})*\beta_i + \ldots + r_{n-2})*\beta_i +$ |
| $r_{n-1}$ | |

Note that the last three multiplications had high powers of Pi and that syndrome $S_i$ is just the sum of the last three products of the multiplier plus the last sum of the adder. That is, $$S_i = (\ldots((r_0*\beta_{i+r1})*\beta_i + \ldots + r_{n/4-2})*\beta_i + r_{n/4-1})*\beta_i^{3n/4} +$$
$$(\ldots(r_{n/4}*\beta_{i+rn/4+1})*\beta_i + \ldots + r_{n/2-2})*\beta_i + r_{n/2-1})$$
$$*\beta_i^{n/2} + (\ldots((r_{n/2}*\beta_{i+rn/2+1})*\beta_i + \ldots + r_{3n/4-2})$$
$$*\beta_i + r_{3n/4-1})*\beta_i^{n/4} + (\ldots((r_{3n/4}*\beta_{i+r3n/4+1})$$
$$*\beta_i + \ldots + r_{n-2})*\beta_i + r_{n-1})$$

Figure 6:
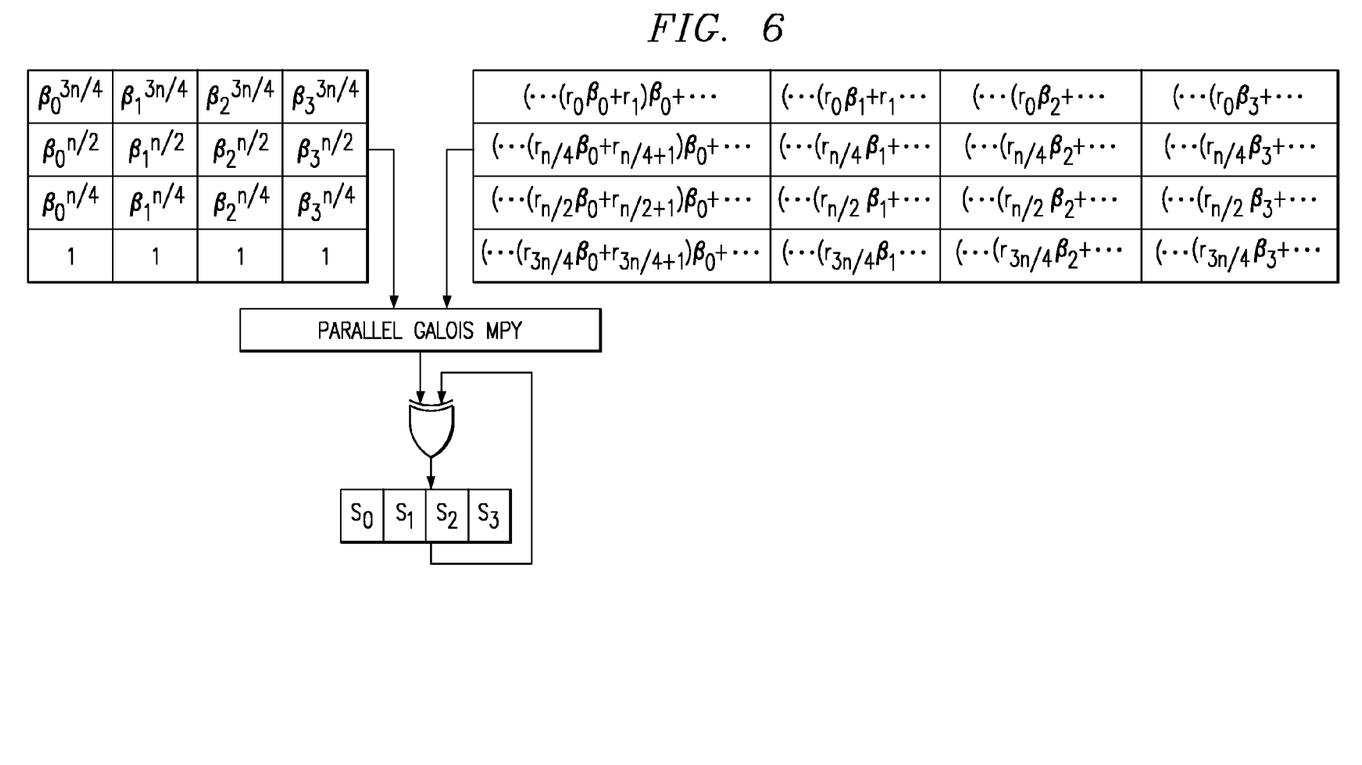

The preferred embodiment performs these last three additions to complete the computation of $S_i$; see FIG. 6. And the parallel aspect of the Galois multiplier (and Galois adder XOR) allows for the simultaneous computations of $\{S_0, S_1, S_2, S_3\}$ by using $\beta_0, \beta_1, \beta_2$, and $\beta_3$ as the four parallel multiplicands as illustrated in FIGS. 5 and 6.

After the foregoing syndrome computations, three more loops of analogous parallel computations yield $\{S_4, S_5, S_6, S_7\}$, $\{S_8, S_9, S_{10}, S_{11}\}$, and $\{S_{12}, S_{13}, S_{14}, S_{15}\}$ which use the corresponding $\{\beta_4, \beta_5, \beta_6, \text{and } \beta_7\}$, $\{\beta_8, \beta_9, \beta_{10}, \text{and } \beta_{11}\}$, and $\{\beta_{12}, \beta^{13}, \beta_{14}, \text{and } \beta_{15}\}$.

When the Galois multiplier has a larger latency, the computations for $\{S_0, S_1, S_2, S_3\}$ and $\{S_8, S_9, S_{10}, S_{11}\}$ could be interleaved, and similarly for $\{S_4, S_5, S_6, S_7\}$ and $\{S_{12}, S_{13}, S_{14}, S_{15}\}$ to effectively double the number of cycles from the time a multiplicand and multiplier are entered into the Galois multiplier and the time that their product is used in another calculation.

Note that since only one memory load (to a byte) is being done every cycle, there will not be any memory bank conflicts in cases of segmented memory.

Alternatives

For the case of n−k=2t=8, there are 8 syndromes $S_i$ for i=0, 1, ..., 7 which are the same as the previously-defined $S_i$. Thus a prferred embodiment uses two loops of analogous computations would yield $\{S_0, S_1, S_2, S_3\}$ and $\{S_4, S_5, S_6, S_7\}$. However, an alternative preferred embodiment retains the four loops of computation and instead partitions the received polynomial into eight subsets beginning at $r_0, r_{n/8}, r_{n/4}, r_{3n/8}, r_{n/2}, r_{5n/8}, r_{3n/4}$, and $r_{7n/8}$, and uses a loop of half the length (n/8 terms rather than n/4) but retains the n/4 offset of t=8 so the subsets are interleaved. Thus each of the computations yields half of one of the 8 syndromes, and these halves are finally combined to yield the syndromes. In particular, the computations would be:

| Multiplier | Adder |
|---|---|
| $r_0*\beta_i$ | |
| $r_{n/4}*\beta_i$ | |
| $r_{n/2}*\beta_i$ | |

-continued

| Multiplier | Adder |
|---|---|
| $r_{3n/4}*\beta_i$ | $r_0*\beta_1 + r_1$ |
| $(r_0*\beta_i + r_1)*\beta_i$ | $r_{n/4}*\beta_i + r_{n/4+1}$ |
| $(r_{n/4}*\beta_i + r_{n/4+1})*\beta_i$ | $r_{n/2}*\beta_i + r_{n/2+1}$ |
| ... | |
| and | |
| $r_{n/8}*\beta_i$ | |
| $r_{3n/8}*\beta_i$ | |
| $r_{5n/8}*\beta_i$ | |
| $r_{7n/8}*\beta_i$ | $r_{n/8}*\beta_i + r_{n/8+1}$ |
| $(r_{n/8}*\beta_i + r_{n/8+1})*\beta_i$ | $r_{3n/8}*\beta_i + r_{3n/8+1}$ |
| $(r_{3n/8}*\beta_i + r_{3n/8+1})*\beta_i$ | $r_{5n/8}*\beta_i + r_{5n/8+1}$ |
| ... | |

Figure 7A:
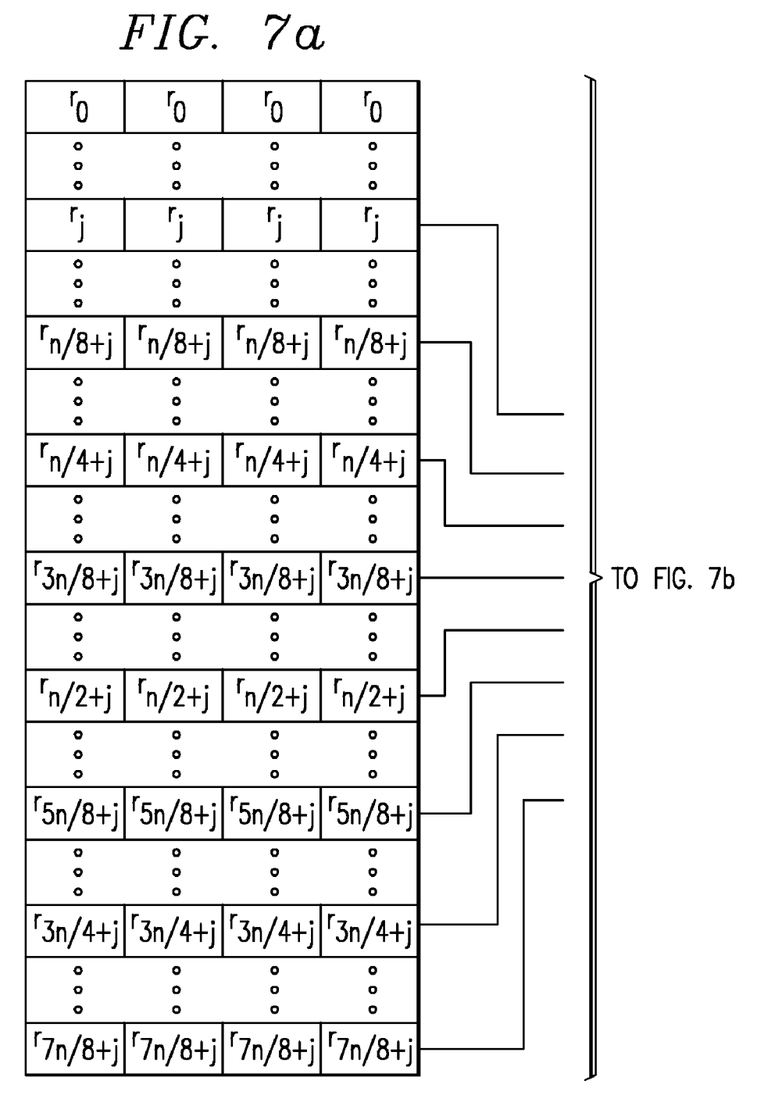
Figure 7B:
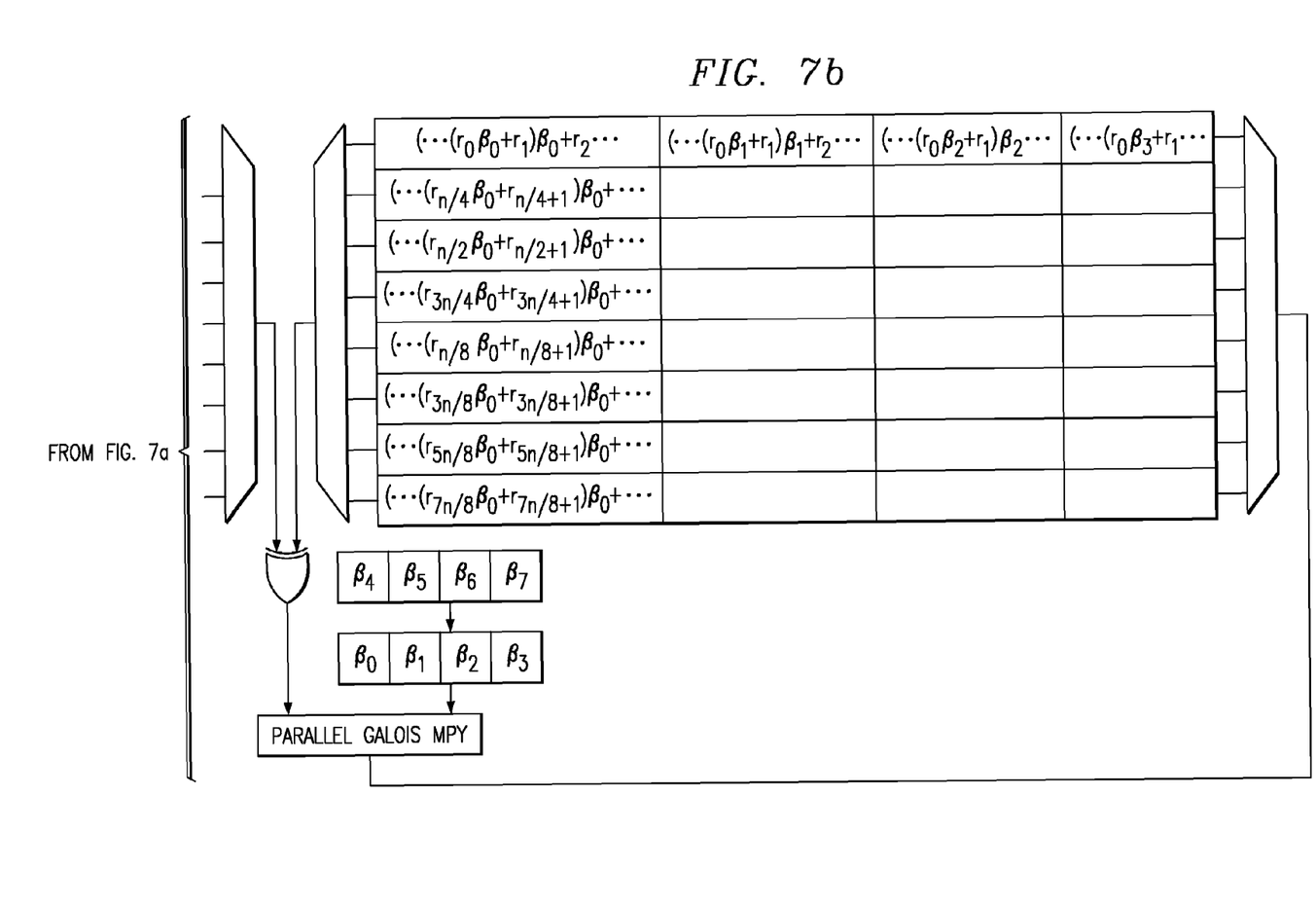

This would be interleaved as illustrated in FIG. 7, and the final summations first combine as before with t=8:

$$S'_i = (\ldots((r_0*\beta_{i+r1})*\beta_i + \ldots + r_{n/8-2})*\beta_i +$$
$$r_{n/8-1})*\beta_i^{7n/8} + (\ldots((r_{n/4}*\beta_{i+rn/4+1})*\beta_i + \ldots +$$
$$r_{3n/8-2})*\beta_i + r_{3n/8-1})*\beta_i^{5n/8} + (\ldots((r_{n/2}*\beta_{i+rn/2+1})$$
$$*\beta_i + \ldots + r_{5n/8-2})*\beta_i + r_{5n/8-1})*\beta_i^{3n/8} + (\ldots((r_{3n/4}$$
$$*\beta_{i+r3n/4+1})*\beta_i + \ldots + r_{7n/8-2})*\beta_i + r_{7n/8-1})*\beta_i^{n/8}$$

and $$S''_i = (\ldots((r_{n/8}*\beta_{i+rn/8+1})*\beta_i + \ldots + r_{n/4-2})*\beta_i + r_{n/4-1})$$
$$*\beta_i^{3n/4} + (\ldots((r_{3n/8}*\beta_{i+r3n/8+1})*\beta_i + \ldots + r_{n/2-2})$$
$$*\beta_i + r_{n/2-1})*\beta_i^{n/2} + (\ldots((r_{5n/8}*\beta_{i+r5n/8+1})$$
$$*\beta_i + \ldots + r_{3n/4-2})*\beta_i + r_{3n/4-1})*\beta_i^{n/4} +$$
$$(\ldots((r_{7n/8}*\beta_{i+r7n/8+1})*\beta_i + \ldots + r_{n-2})*\beta_i + r_{n-1}$$

Lastly, $S_i = S'_i + S''_i$. Of course, the three multiplications of the Homer's method partial results by powers of $\beta_i$ in the summation to form $S'_i$ are the same power as for $S''_i$ with an additional multiplication by $\beta_i^{n/8}$; that is, $(\beta_i^{7n/8}; \beta_i^{5n/8}; \beta_i^{3n/8}; \beta_i^{n/8}) = \beta_i^{n/8} * (\beta_i^{3n/4}; \beta_i^{n/2}; \beta_i^{n/4}; 1)$.

Note that essentially the computations of $\{S_8, S_9, S_{10}, S_{11}\}$ for t=8 are used to compute the last half of $\{S_0, S_1, S_2, S_3\}$ for t=4 by using $\beta_0, \beta_1, \beta_2, \beta_3$, in place of $\beta_8, \beta_9, \beta_{10}, \beta_{11}$, an offset starting point of n/8, and only n/8 terms instead of n/4. Analogously, use the computations of $\{S_{12}, S_{13}, S_{14}, S_{15}\}$ for t=8 to compute the last half of $\{S_4, S_5, S_6, S_7\}$ for t=4.

The foregoing partitioning the received polynomial into 8 subsets allows essentially the same program to handle both the t=8 and t=4 cases. Thus a modem which monitors error rates and adaptively adjusts code parameters can use the same program footprint.

For the cases of n odd or certain n even, n/2, n/4, or n/8 may not necessarily be integers. In such cases the same computation loops can be used after padding the codeword with 0 bytes at the $r_0$ end to increase n to a multiple of 8 or 4 as needed. Again, the same program for the syndrome computations is used and minimizes program memory used.

Modifications

The preferred embodiments can be modified in various ways while retaining the features of BCH decoding with a syndrome method including a partition of the received polynomial (block of symbols) into subsets and interleaved subset partial syndrome evaluations (to overcome multiplier latency) followed by a combination of partial syndrome evaluations and parallel evaluations with a parallel multiplier and parallel adder and scalable evaluations for use with changes in code error-correction capabilities such as t changing from 8 to 4.

For example, various Galois fields could be used; in particular, $GF(2^m)$ for m less than 8 can immediately be implemented by just using only the m lefthand bits of a symbol byte: the Galois multiplier yields a product in the same lefthand m bits for a given m by applying a corresponding mask in the partial product combinations.

Further, codes with various error-correction capabilities (e.g., t values from 1 to 8) can be handled by the same syndrome method with further partitioning of the received polynomial and use of a higher t value for odd t. For t larger than 8, the method can be scaled up by just increasing the number of evaluation loops: if the Galois multiplier can handle P parallel multiplies, then $\lceil 2t/P \rceil$ loops suffice, and if the Galois multiplier has a latency of L cycles, then partition the received block of n symbols into at least L subsets for interleaved Horner's methods on the subsets (with loops of length $\lceil n/L \rceil$) to yield P partial syndromes in parallel. And decreases in t may allow use of the same number of loops but with a subdivision of the subsets and the loop length for a subdivision of the partial syndromes among multiple loops.

What is claimed is:

1. A method of BCH decoding, comprising:
   (a) partitioning a received block of n symbols into N subsets of successive symbols with N an integer greater than 1;
   (b) simultaneously evaluating a partial syndrome for each of said N subsets, wherein said evaluating comprises parallel evaluations for first and second roots of a generator of a BCH code; and
   (c) combining said partial syndrome evaluations for each of said N subsets to form a first syndrome evaluation.

2. The method of claim 1, wherein:
   said combining of step (c) of claim 1 includes parallel formation of first and second syndromes corresponding to said first and second roots, respectively.

3. A method of syndrome evaluation in BCH decoding, comprising:
   (a) providing a Galois multiplier with latency L cycles with L an integer greater than 1 for P parallel multiplications with P a positive integer;
   (b) partitioning a received block of n symbols into N subsets with N an integer at least equal to L;
   (c) simultaneously evaluating in parallel partial syndromes for each of said N subsets;
   (d) combining said partial syndrome evaluations to form P syndrome evaluations; and
   (e) using said P syndrome evaluations for decoding said received block of n symbols.

4. A method of syndrome evaluation in BCH decoding, comprising:
   (a) providing a Galois multiplier with latency L cycles with L an integer greater than 1 for P parallel multiplications with P a positive integer;
   (b) partitioning a received block of n symbols into MN subsets with N an integer at least equal to L and M a positive integer;
   (c) evaluating in parallel partial syndromes for each of said MN subsets, said evaluating simultaneous for groups of N of said MN subsets;
   (d) combining said partial syndrome evaluations to form P syndrome evaluations; and
   (e) using said P syndrome evaluations for decoding said received block of n symbols.

5. The method of claim 4, wherein:
   (a) when said M is at least 2, said evaluating of step (b) of claim 4 is the analog of said evaluating of step (b) when M=1 and over 1/M portion of each subset.

* * * * *